United States Patent
Butterworth

(10) Patent No.: US 9,634,208 B2
(45) Date of Patent: Apr. 25, 2017

(54) SHALLOW REFLECTOR CUP FOR PHOSPHOR-CONVERTED LED FILLED WITH ENCAPSULANT

(71) Applicant: KONINKLIJKE PHILIPS N.V., Eindhoven (NL)

(72) Inventor: Mark Melvin Butterworth, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/107,867

(22) PCT Filed: Jan. 14, 2015

(86) PCT No.: PCT/IB2015/050278
§ 371 (c)(1),
(2) Date: Jun. 23, 2016

(87) PCT Pub. No.: WO2015/114477
PCT Pub. Date: Aug. 6, 2015

(65) Prior Publication Data
US 2017/0062678 A1   Mar. 2, 2017

Related U.S. Application Data

(60) Provisional application No. 61/932,851, filed on Jan. 29, 2014.

(51) Int. Cl.
*H01L 33/00* (2010.01)
*H01L 33/60* (2010.01)
(Continued)

(52) U.S. Cl.
CPC ............ *H01L 33/60* (2013.01); *H01L 33/502* (2013.01); *H01L 33/505* (2013.01); *H01L 33/52* (2013.01); *H01L 33/62* (2013.01)

(58) Field of Classification Search
CPC ....... H01L 33/60; H01L 33/502; H01L 33/52; H01L 33/62; H01L 33/486; H01L 33/48;
(Continued)

(56) References Cited

U.S. PATENT DOCUMENTS

2002/0185966 A1   12/2002 Murano
2006/0157722 A1   7/2006 Takezawa et al.
(Continued)

FOREIGN PATENT DOCUMENTS

EP   1919002 A    5/2008
JP   5374002 B1   12/2013
JP   2014011359 A  1/2014

OTHER PUBLICATIONS

EPO as ISA, International Search Report and Written Opinion dated Jun. 1, 2015 from International Application No. PCT/IB2015/050278, filed Jan. 14, 2015, 11 pages.

*Primary Examiner* — Yosef Gebreyesus
(74) *Attorney, Agent, or Firm* — Patent Law Group LLP; Brian D. Ogonowsky

(57) ABSTRACT

An LED die (26) conformally coated with phosphor (28) is mounted at the base (24) of a shallow, square reflector cup (16). The cup has flat reflective walls (20) that slope upward from its base to its rim at a shallow angle of approximately 33 degrees. A clear encapsulant (30) completely fills the cup to form a smooth flat top surface. Any emissions from the LED die or phosphor at a low angle (48, 50) are totally internally reflected at the flat air-encapsulant interface toward the cup walls. This combined LED/phosphor light is then reflected upward by the walls (20) and out of the package. Since a large percentage of the light emitted by the LED and phosphor is mixed by the TIR and the walls prior to exiting the package, the color and brightness of the reflected light is fairly uniform across the beam. The encap- (Continued)

sulant is intentionally designed to enhance TIR to help mix the light.

11 Claims, 4 Drawing Sheets

(51) Int. Cl.
    *H01L 33/50*     (2010.01)
    *H01L 33/52*     (2010.01)
    *H01L 33/62*     (2010.01)

(58) Field of Classification Search
    CPC .............. H01L 33/58; H01L 33/507; H01L 2224/73265; H01L 2224/48247; H01L 2224/48091
    See application file for complete search history.

(56) References Cited

U.S. PATENT DOCUMENTS

| | | | |
|---|---|---|---|
| 2007/0258241 A1* | 11/2007 | Leatherdale | H01L 33/58 362/244 |
| 2007/0278513 A1 | 12/2007 | Chikugawa | |
| 2008/0089053 A1* | 4/2008 | Negley | H01L 33/505 362/84 |
| 2012/0097986 A1 | 4/2012 | Ku et al. | |
| 2013/0337591 A1 | 12/2013 | Chen | |

* cited by examiner

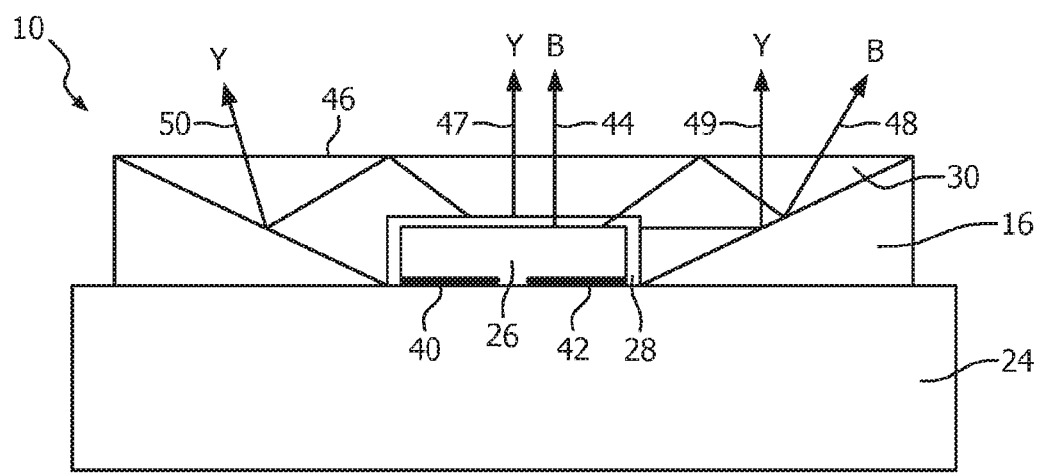
FIG. 5
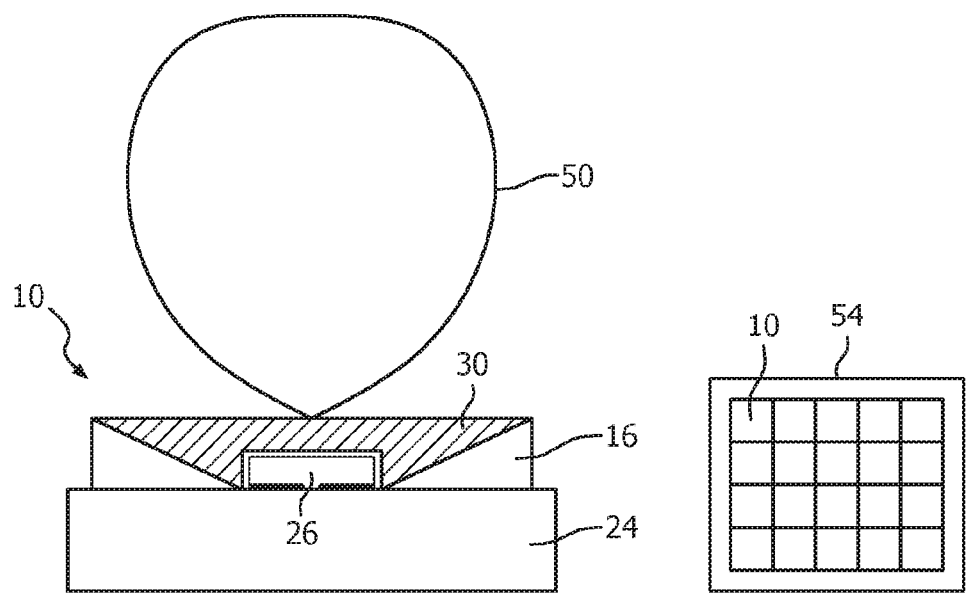
FIG. 6
FIG. 7

SHALLOW REFLECTOR CUP FOR PHOSPHOR-CONVERTED LED FILLED WITH ENCAPSULANT

CROSS-REFERENCE TO RELATED APPLICATIONS

The present application is a §371 application of International Application No. PCT/IB2015/050278 filed on Jan. 14, 2015 and entitled "SHALLOW REFLECTOR CUP FOR PHOSPHOR-CONVERTED LED FILLED WITH ENCAPSULANT," which claims priority to U.S. Provisional Patent Application No. 61/932,851 filed Jan. 29, 2014. Both PCT/IB2015/050278 and 61/932,851 are incorporated herein.

FIELD OF THE INVENTION

This invention relates to packaged light emitting diodes (LEDs) and, in particular, to a phosphor-converted LED die in a shallow reflective cup filled with a clear encapsulant.

BACKGROUND

It is common to mount an LED die on a printed circuit board (PCB), or other substrate, for electrically connecting electrodes of the LED to conductive traces on the PCB. Then, a round reflector cup with a center hole is affixed to the PCB and surrounds the LED die. For phosphor conversion, the cup is then completely filled with a viscous phosphor mixture and cured to encapsulate the LED die. The combination of the LED die light and the phosphor light creates the desired overall light color, such as white light. The cup somewhat limits the side light emission of the LED die and redirects the side light in a generally forward direction.

In some cases, a hemispherical lens containing an encapsulant is affixed over the LED die to improve light extraction. This requires a large center hole in the cup to accommodate the lens.

One drawback of the above-described packaged LED is that the light emission profile of the phosphor light is very wide. Since the phosphor is at, or even slightly above, the rim of the conical cup, the phosphor light out of the cup is almost Lambertian. Since the LED die itself is fairly low in the cup, the direct light from the LED die is more sharply limited by the cup, so the direct light from the LED die exiting the cup is much narrower than Lambertian and much narrower than the phosphor light. Therefore, assuming the LED die emits blue light and the phosphor emits yellow light, there will be a yellow halo around the more central white light in the beam. This is often referred to as a phosphor halo effect.

Some examples of reflective cups filled with phosphor are shown in US publication 2013/0228810.

Encapsulation of an LED die is important to increase light extraction efficiency, and the encapsulant is designed to have an index of refraction (n) somewhere between the high index of the LED die (e.g., n=2.5-3 for a GaN LED) and air (n=1). In some LED dies, the LED die light exits from a top sapphire window with an index of about 1.8. The index of a conventional silicone encapsulant (including a lens) can be from 1.4 to 1.7. The encapsulation is thus designed to reduce the total internal reflection (TIR) inside the LED die. Encapsulation gain can account for a 10 to 20 percent increase in light output. The encapsulation shape is also designed to minimize the TIR at the encapsulant-air interface.

Dome-shaped encapsulation is popular since the rays of light emitted by the LED die impinge on the surface of the dome generally at right angles. This minimizes TIR. If an encapsulation shape resembles a rectangular prism, there will be relatively high TIR, due to the LED die light rays impinging on the flat encapsulant-air interface at low angles, and the symmetry of the shape does not allow light to escape. Therefore, encapsulants having a flat top surface (exposed to the air) are not used in actual products, although they may be illustrated in simplified schematic examples of packaged LEDs.

Some other known shapes of the encapsulant include pyramids, which have angles that break symmetry and allow the light to escape. However, TIR from the pyramid causes some of the light to be absorbed by the LED die and its mounting substrate. Some pyramid type structures have angular grooves cut in their outer surface to reduce TIR.

For various reasons, the user may not be content with a generally circular beam from a conical cup that has poor color uniformity due to the phosphor halo effect. Also, since lenses increase the height of the package, the user may want a shallower package that does not require a lens to encapsulate the LED die.

What is needed is a new design for a packaged LED that does not suffer from the drawbacks of the above-described prior art.

SUMMARY

A packaged LED die is described that uses a shallow, rectangular reflective cup having four flat walls that slope upward at a shallow angle of about 33 degrees. The LED die is mounted at the base of the reflector, where the base includes bonding pads for the LED die electrodes. The below description assumes a blue LED and a YAG yellow emitting phosphor, although other combinations of LED color and phosphor emissions (e.g., a blue LED, YAG phosphor, and a red emitting phosphor) are contemplated and are included within the scope of the invention.

The LED die has a conformal phosphor coating, which may be applied by any method, such as electrophoresis, spraying, or any other suitable technique. The conformal phosphor coating is applied to the LED die prior to mounting the LED die in the cup. Since the phosphor coating may be dense, it may be very thin to minimize the required height of the package. The rim of the cup is higher than the conformal phosphor.

The light exit aperture of the cup is substantially a square, so that the beam will be generally square. Other rectangular shapes are envisioned and are included within the scope of the invention.

A clear encapsulant, such as silicone, substantially fills the cup to above the phosphor and has a smooth flat top surface to promote total internal reflection (TIR) at the encapsulant-air interface, in accordance with Snell's Law.

The shallow angle of the walls of the cup are designed so that a portion of the side light from the phosphor and the LED active layer are directly reflected off the walls of the cup and out through the flat top of the encapsulant without any TIR. Light from the top of the LED die and the overlying phosphor impinging on the flat top surface of the encapsulant at less than the critical angle will be reflected by TIR downwards toward the reflective walls and reflected out of the package with no additional TIR. Therefore, virtually all light exits the package with at most two reflections. Light is not significantly reflected back into the LED die so is not absorbed.

Since a significant portion of the light from the top of the LED die and the phosphor is intentionally redirected by TIR to the cup walls (and thus spread out), the blue light from the LED die (assuming a GaN LED) is better mixed with the phosphor light, so the resulting beam will have improved color uniformity around its perimeter. The beam will be generally rectangular, and any phosphor halo effect is reduced or eliminated. Since the low-angle LED die light and phosphor light are similarly internally reflected and redirected by the cup walls, the beam will be well-defined. Since no lens is required and the phosphor coating can be dense, the package can be made very shallow.

Since the cup is square, an array of cups can be mounted close together to form any shape with only a small gap between the packages. Further, the resulting composite surface will be flat. This flat surface can be easily cleaned and is aesthetically pleasing. Further, since the phosphor (assuming a YAG yellow phosphor) does not fill the cup, there is only a small yellow spot in the center of each package, which is more aesthetically pleasing than the prior art cups filled with YAG phosphor. Further, the rectangular beams blend together very well when an array of the packages is used. The prior art circular beam emissions of the reflective cups would not uniformly blend in such an array.

The cup may be plastic and molded over a lead frame, where the lead frame forms the bonding pads in the center of the cup for the LED die electrodes. The walls of the cup may be coated with a metal film or a specular or diffusing layer. Therefore, no underlying PCB is needed, and the package is a minimum size.

In one embodiment, the LED die has sides of about 0.5-1 mm and a height less than its sides. The height of the square cup may be slightly greater than the top of the phosphor coating and may be less than 1 mm. The distance from the edge of the LED die to the outer edge of the cup is about 1 mm or less. The flat walls of the cup rise from proximate the LED die to the rim of the cup at preferably about a 33 degree angle.

Additional features and embodiments are described herein.

BRIEF DESCRIPTION OF THE DRAWINGS

FIG. 5 is the cross-sectional view of FIG. 3 illustrating various light rays emitted by the LED die and the phosphor and how the light exits the package with, at most, two reflections, one being TIR and the other being a reflection off a wall of the cup.

FIG. 6 illustrates the cross-sectional view of FIG. 3 showing an approximate light emission profile, wherein the light emission is narrower and more defined than that of a cup filled with phosphor and wherein the mixed light has better color uniformity.

FIG. 7 illustrates how a plurality of square packages 10 may be mounted on a common substrate in an array to create a rectangular beam with uniform color and brightness across the beam or, alternatively, create an efficient color display.

Elements that are the same or similar are labeled with the same numeral.

DETAILED DESCRIPTION

Figure 1:
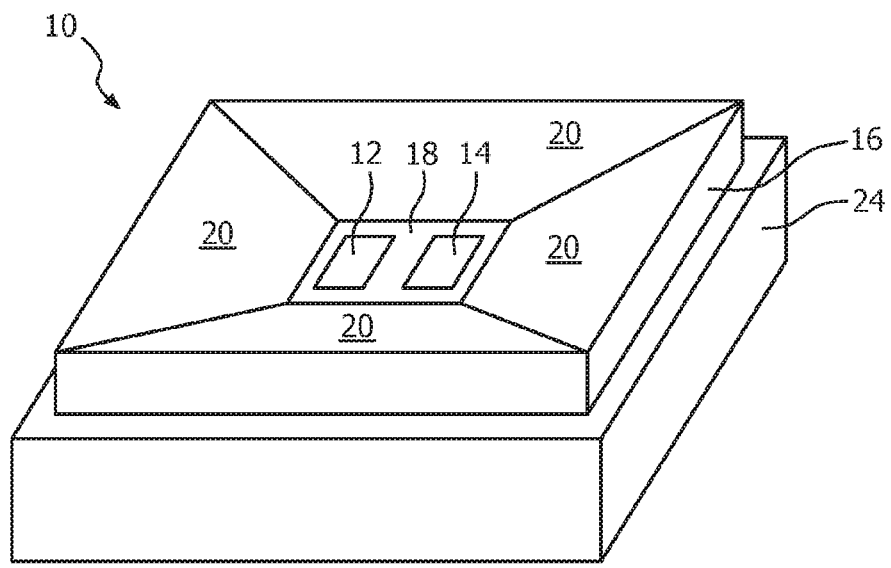
FIG. 1 is a perspective view of a shallow reflective cup molded over a lead frame, where bonding pads for the LED die electrodes are shown, in accordance with one embodiment of the invention.

FIG. 1 illustrates a reflective cup package 10 in accordance with one embodiment of the invention. Typically, a copper lead frame is stamped from a sheet to form the metal pads 12 and 14 of the package 10. There may be an array of lead frames connected together to simplify processing of the packages, and the lead frames are separated after the processing into the individual packages 10.

The area where the copper lead frame is to be bonded to the bottom LED die electrodes may be plated with a suitable metal, such as gold, nickel, or alloys, to form pads 12 and 14. Gold balls, solder wetting, or other techniques, if required, may also be used to allow bonding to the die electrodes. Any portion of the lead frame that is used for an electrical connection is referred to herein as a bonding pad, whether the connection is by solder, ultrasonic weld, wire bond, conductive epoxy, etc.

A plastic cup 16 is molded over the lead frame. An identical plastic cup is simultaneously molded over each lead frame in the array. Compression molding or injection molding may be used. Preferably, the plastic is thermally conductive. If the plastic is also electrically conductive due to containing metal particles (for increasing its thermal conductivity), the portion of the lead frame in contact with the plastic has a dielectric coating formed over it prior to the molding step to prevent shorting the pads 12 and 14 to each other.

The cup 16 generally forms a square center base 18, a square outer perimeter, and a square aperture. The interior walls 20 of the cup 16 are flat and extend from the base 18 to the perimeter at about a 33 degree angle. Although 33 degrees is preferred, a range between 28-38 degrees is also suitable, depending on the desired shape of the beam.

FIG. 1 also illustrates a substrate 24 that the cup 16 is mounted on that may act as an interposer between the cup 16 and a printed circuit board and helps to spread heat. The substrate 24 may be a molded ceramic, plastic, or other thermally conductive material. In one embodiment, the substrate 24 is an integral part of the plastic cup 16 molded over the lead frame so is considered part of the cup 16. In an alternative embodiment, the substrate 24 may be eliminated and the lead frame may be used to attach the package 10 to a circuit board.

The interior walls 20 of the cup 16 are coated with a reflective film of, for example, a specular reflective metal such as aluminum or silver. Evaporation, sputtering, spraying, or other technique may be used. The interior walls 20 may instead be coated with other types of film, such as a dichroic coating, that reflect the direct LED die light and the phosphor light or only reflect the LED light or only reflect the phosphor light. The reflective material may be specular for the narrowest beam or may be diffusive (such as by using white paint) for a wider beam.

Figure 2:
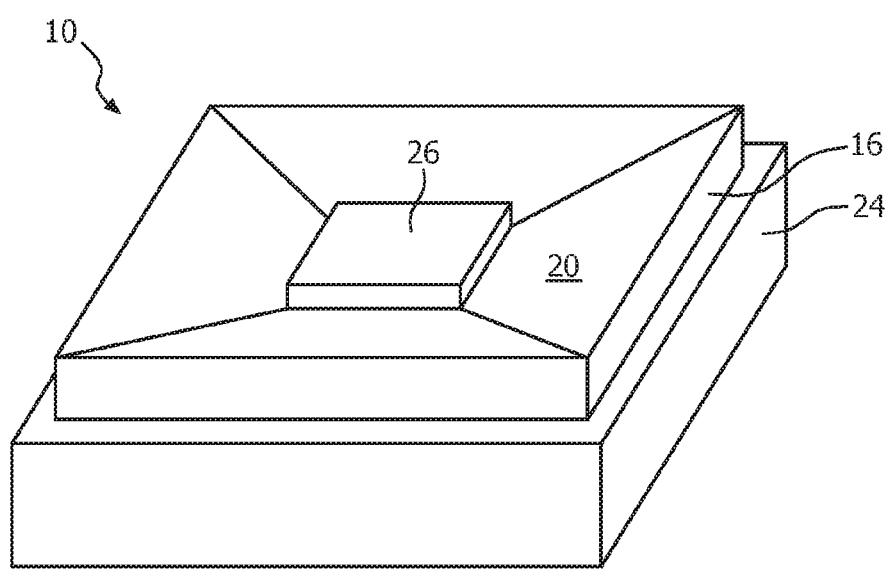
FIG. 2 illustrates the cup of FIG. 1 after an LED die has been mounted in the cup.

FIG. 2 illustrates the LED die 26 mounted on the base of the cup 16. In the example, the LED die 26 is a GaN-based flip-chip and emits blue light. In another embodiment, the LED die 26 may emit UV and/or is not a flip-chip. For LED dies with one or both electrodes on top, a wire may connect the electrode(s) to the pads 12/14 and the pads 12/14 would extend beyond the LED die footprint. Any metal thermal pad of the LED die is thermally coupled to the base of the cup 16.

Figure 3:
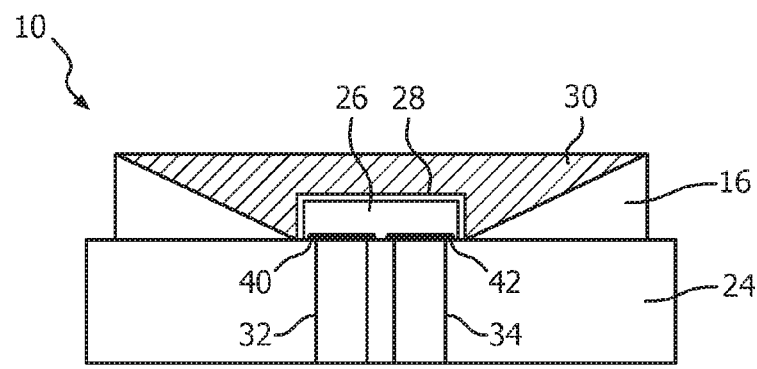
FIG. 3 is a bisected cross-sectional view of FIG. 2, illustrating a conformal phosphor layer over the LED die and the cup being filled with a clear encapsulant to complete the package.

The LED die 26 is coated with a layer of phosphor 28, shown in FIG. 3, prior to being mounted. The phosphor 28 may be a type, such as YAG, where the combination of the blue LED die light leaking through the phosphor 28 and the yellow-green phosphor light combine to create white light. Other or additional phosphors may be used to create other colors, including a warmer white. The phosphor 28 may conformally coat the LED die 26 using electrophoresis, spraying, or any other known process.

In one embodiment, the LED die 26 has sides of about 0.5-1 mm and a height less than its sides. The height of the square cup 16 from its base 18 to its top rim is greater than the height of the top surface of the phosphor 28 and may be less than 1 mm. The distance from the edge of the LED die 26 to the outer edge of the cup 16 may be about 1 mm or less. Accordingly, the footprint of the entire package 10 may be less than 3 mm per side or the footprint may be larger. The height of the cup 16 and angle of the interior walls 20 are generally dictated by what is needed to cause virtually all light to exit the package 10 with a maximum of two reflections, discussed below.

The size of the substrate 24 is not relevant to the operation of the invention and typically has a footprint slightly larger than the cup 16.

In an alternative embodiment, the cup 16 has a square opening that exposes the pads 12/14 on a separately formed substrate 24. The cup 16 is affixed to the substrate 24 with an adhesive.

As shown in FIG. 3, the cup 16 is then filled substantially to its top rim with a clear encapsulant 30, such as silicone (shown hatched), where the top surface of the encapsulant 30 is flat and smooth to promote TIR. FIG. 3 is a bisected view of FIG. 2 after filling with the encapsulant 30. The encapsulant 30 has an index of refraction approximately that of the phosphor 28 or between the index of the phosphor 28 and air. The relative indices are important, as discussed below, since the TIR at the flat encapsulant surface is used to help mix the light and increase the amount of light that is reflected off the interior walls 20.

Figure 4:
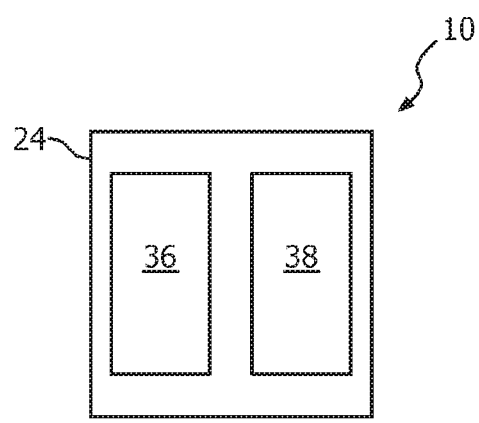
FIG. 4 is bottom up view of the package showing bonding pads for bonding to a printed circuit board or other substrate.

FIG. 3 also shows conductive vias 32 and 24, which may be part of the molded-over lead frame, which extend from the pads 12/14 (FIG. 1) to the bottom pads 36/38 (shown in FIG. 4) of the substrate 24. FIG. 3 also shows the electrodes 40/42 of the LED die 26 which are electrically connected to pads 12/14 in FIG. 1.

The relative indices of the LED die 26, phosphor 28, and encapsulant 30 result in a high light extraction efficiency from the LED die 26 and phosphor 28 into the encapsulant 30. FIG. 5 illustrates a variety of light rays emitted from the LED die 26 and phosphor 28 into the encapsulant 30.

A blue light ray 44 from the LED die's active layer is shown being emitted from the top surface of the LED die 26 substantially normal to the flat light exit surface 46 of the encapsulant 30. Accordingly, there is no TIR. A yellow light ray 47 from the phosphor 28 (assuming YAG) is shown emitted normal to the surface 46 and mixes with the blue light ray 44 to create white light.

Another blue light ray 48 impinges at a low angle at the surface 46 (below the critical angle) and is internally reflected in accordance with Snell's law. This blue light ray 48 is then reflected upward by the specular reflective interior wall 20. The angle of the reflected light ray 48 is high, as determined by the angle of the interior wall 20, and escapes the encapsulant 30 without any further TIR. A yellow light ray 49 from the side of the phosphor 28 (assuming YAG) is directly reflected off the interior wall 20 and mixes with the blue light ray 48 to create white light.

Another yellow light ray 50 from the phosphor 28 is also emitted at a low angle and is internally reflected at the surface 46. This light ray 50 acts similarly to the blue light ray 48 and exits after, at most, two reflections.

Other blue and yellow light rays at low angles are internally reflected at the surface 46 and mixed in the encapsulant 30 and at the interior walls 20. The encapsulant 30 thus acts as a mixer, with the mixed light reflecting off the interior walls 20 being fairly uniformly white. If the surface 46 were domed or grooved, there would be more light exiting directly from the top surface of the LED die 26, and there would be more of a phosphor halo effect with the light emitted from the package having a yellow halo.

Although the light is well mixed surrounding the LED die 26, the blue light rays 44 directly exiting the surface 46 cause there to be a bluer spot in the center of the package. However, this blue light mixes with the other light at a distance to create a fairly uniform square shaped beam of light.

The height of the encapsulant 30 above the top of the phosphor 28 should be sufficient to allow the internally reflected light rays (e.g., rays 50 and 48) to not be absorbed by the phosphor 28 or LED die 26 but to impinge on the interior walls 20.

Although the ideal package 10 results in the light exiting after, at most, two reflections, there may be imperfections in the surfaces or materials of an actual product that may cause a small portion of the LED light and/or the phosphor light to not be perfectly reflected at the incident angle. Therefore, a small portion of the LED light and/or phosphor light may exit after more than two reflections.

No lenses are used in the preferred embodiment since the cup 16 shapes the beam to have the desired emission profile, and a lens is not needed for increasing the light extraction efficiency. Any lens would add greatly to the package's height.

The cup 16 can be very shallow (slightly higher than the phosphor 28 top surface) since the TIR will still be performed at the surface 46 irrespective of the thickness of the encapsulant 30.

In prior art reflective cups, a liquid phosphor encapsulant completely fills the cup and is then cured. The transparent binder for the phosphor power comprises a significant volume of the phosphor mixture. Therefore, the phosphor mixture must be fairly thick over the LED die to achieve the required effective thickness of phosphor powder to achieve the desired overall color. Therefore, the prior art cup had to be fairly deep. In the embodiment of FIG. 5, since the phosphor 28 need not be mixed with a binder and is relatively dense and thin, the layer of phosphor 28 is much thinner than the prior art phosphor "goop" in the cup. Also, since the height of the encapsulant 30 above the phosphor 28 can be the minimum while achieving the desired TIR, the cup 16 can be very shallow. Accordingly, the package 10 is thinner than prior art packages employing phosphor "goop" in a cup.

FIG. 6 illustrates a cross-section of the package's light emission profile 50. The profile 50 is much narrower than that of a package where the reflective cup is completely filled with phosphor, since, in the embodiment of FIG. 6, any phosphor and LED die emission at a low angle is internally reflected by TIR then reflected upward by the interior wall 20. The profile 50 has a generally square shaped horizontal cross-section.

Depending on the application, the bottom pads 36/38 (FIG. 4) may be soldered to metal pads on a printed circuit board (PCB) or other substrate to supply power to the LED die 26.

As shown in FIG. 7, the flat and square shape of each package 10 allows an array of packages 10 to be mounted on a common substrate 54 and the LED dies to be selective energized or energized together. Since each package 10 emits a square beam, the beams uniformly overlap, in contrast to prior art circular beams. There is only a small gap between each of the packages 10. Thus, a very bright square and uniform beam may be created. Also, since the top surface of the package 10 is flat, it may form part of the flat outer surface of a product, such as a smartphone, and be aesthetically pleasing. The rectangular cup perimeters may be other than squares, depending on the desired characteristics of the beam.

If the package 10 is used as a flash for a camera, the lengths of the sides of the cup 16 may be tailored to create the same aspect ratio as the picture aspect ratio to maximize the useful light projected onto the subject. In such a case, the cup would not be a square.

Instead of all the packages in the array emitting the same color light (e.g., white), the packages may emit blue, green, and red light to form RBG pixels, where the LED dies in the different packages may be selectively energized to create a color display with a minimal distance between pixels. In one embodiment, all the LED dies emit UV or blue light, and the different colors are obtained by different phosphors. In another embodiment, the different colors are obtained by different active layers in the LED dies. In another embodiment, there is a mixture of phosphor-converted LEDs and non-phosphor-converted LEDs.

Heat from the LED die 26 is removed by a combination of the air over the LED die 26, the lead frame, the plastic cup 16, the substrate 24, and the PCB.

In another embodiment, the cup 16 is a solid piece of a reflective metal, such as aluminum, that is stamped from a sheet. In that way, the inner edges of the cup 16 may be knife edges so as not to reflect back any light from the LED die. The cup 16 may be affixed to the substrate 24 using an epoxy or silicone.

Figure 8:
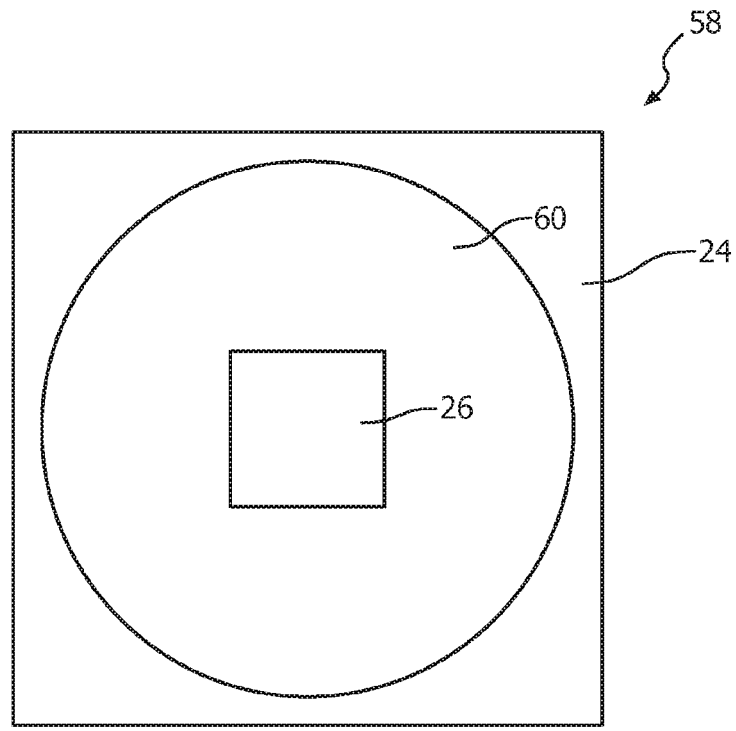
FIG. 8 is a top down view of a package where the reflector has a round exit opening for producing a circular beam.

FIGS. 1-7 describe a package that emits a generally rectangular beam. In some cases, it is desired to emit a circular beam. FIG. 8 is a top down view of a package 58 where the reflective cup 60 has a round exit opening for producing a circular beam.

Figure 9:
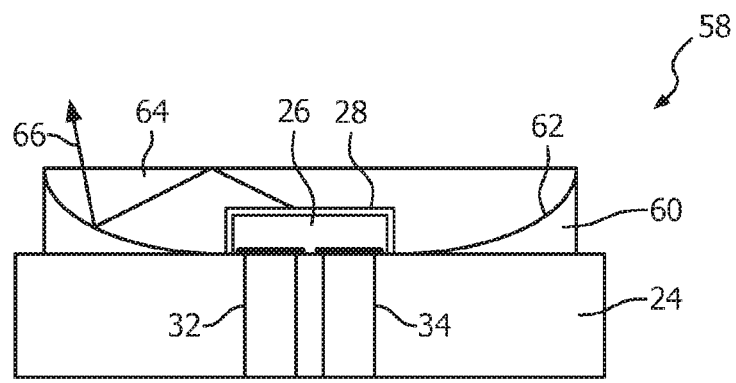
FIG. 9 is a bisected cross-sectional view of the package of FIG. 8.

FIG. 9 is a bisected cross-sectional view of the package 58 of FIG. 8.

The substrate 24 and LED die 26 may be identical to those of FIGS. 1-3. The reflective cup 60 may be molded from a plastic, and the reflective surface 62 may be the same reflective layer described above. Alternatively, the cup 60 is stamped from a reflective metal sheet. As in the package of FIGS. 1-7, the substrate 24 and cup 60 may be a single integral plastic piece molded over the lead frame or may be separate pieces. The shallow cup 60 is filled with a transparent encapsulant 64, such as silicone, whose index of refraction is selected to provide the desired TIR. Light rays 66 from the LED die 26 and phosphor 28 below the critical angle reflect off the encapsulant's top surface back towards the walls of the cup 60 and are redirected upwards to exit the encapsulant 64 without further TIR. Accordingly, as in the embodiments of FIGS. 1-7, there is at most one TIR reflection within the package and at most one cup reflection within the package before the light exits the package.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting device comprising:
   a reflective cup having reflective surfaces that slope upward from a central portion of the cup;
   a light emitting diode (LED) die mounted in the central portion of the cup emitting first light of a first wavelength;
   a conformal phosphor coating over the LED die; and
   a clear encapsulant filling the cup to at least cover a top of the phosphor coating, the encapsulant having a smooth, flat outer surface substantially parallel to a top surface of the LED die,
   wherein the phosphor coating absorbs a portion of the first light and emits a second light of a second wavelength,
   wherein the encapsulant has an air-encapsulant interface and is arranged such that a portion of the first light and the second light intercept the air-encapsulant interface at an angle below a critical angle and is totally internally reflected as a first reflected light in a direction toward at least one of the reflective surfaces,
   wherein the reflective surfaces reflect the first reflected light as a second reflected light in a direction that passes through the air-encapsulant interface,
   wherein the cup has a rectangular aperture and reflective flat surfaces that slope upward from the central portion of the cup to the aperture,
   wherein the slope of the flat surfaces is monotonic and between 28-38 degrees,
   wherein the encapsulant substantially fills the cup to form a smooth top surface of the cup and the encapsulant,
   the device further comprising an array of substantially identical cups mounted on a common substrate such that the array has a substantially flat top surface, and each of the cups emits a substantially rectangular beam which overlaps with rectangular beams from other cups in the array.

2. The device of claim 1 wherein the slope of the flat surfaces is approximately 33 degrees.

3. The device of claim 1 wherein the cup has a square shaped outer perimeter.

4. The device of claim 1 wherein the phosphor coating comprises phosphor powder without a clear binder.

5. The device of claim 1 wherein the LED die emits blue light and wherein the phosphor coating emits a light that, when combined with the blue light, creates a white light.

6. The device of claim 1 wherein a portion of the first light and a portion of the second light exit the encapsulant after a maximum of a single reflection off the encapsulant-air interface and a single reflection off the reflective surfaces.

7. The device of claim 1 wherein substantially all of the first light and substantially all of the second light exit the encapsulant after a maximum of a single reflection off the encapsulant-air interface and a single reflection off the reflective surfaces.

8. The device of claim 1 wherein the cup comprises plastic molded around a lead frame.

9. The device of claim 1 wherein the device forms a complete package for the LED die.

10. The device of claim 1 wherein a height of the cup between its central portion and a rim of the cup is less than 1 mm.

11. The device of claim 1 wherein a distance from the central portion to a perimeter of the cup is less than 1 mm.

\* \* \* \* \*